(12) United States Patent
England et al.

(10) Patent No.: US 7,622,722 B2
(45) Date of Patent: Nov. 24, 2009

(54) ION IMPLANTATION DEVICE WITH A DUAL PUMPING MODE AND METHOD THEREOF

(75) Inventors: Jonathan Gerald England, Horsham (GB); Christopher R. Hatem, Cambridge, MA (US); Jay Thomas Scheuer, Rowley, MA (US); Joseph C. Olson, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 276 days.

(21) Appl. No.: 11/866,099

(22) Filed: Oct. 2, 2007

(65) Prior Publication Data
US 2008/0105833 A1    May 8, 2008

Related U.S. Application Data

(60) Provisional application No. 60/857,954, filed on Nov. 8, 2006.

(51) Int. Cl.
*H01J 49/10* (2006.01)
*H01J 49/24* (2006.01)

(52) U.S. Cl. .............................. 250/423 R; 250/492.21; 250/281; 250/282; 250/288; 250/441.11; 315/111.81

(58) Field of Classification Search ............. 250/423 R, 250/492.21, 281, 282, 288, 441.11; 315/111.81
See application file for complete search history.

(56) References Cited

U.S. PATENT DOCUMENTS

| | | | |
|---|---|---|---|
| 4,791,273 A | 12/1988 | Satoh et al. | |
| 4,793,908 A | 12/1988 | Scott et al. | |
| 4,800,100 A | 1/1989 | Herbots et al. | |
| 5,554,257 A | 9/1996 | Yokogawa et al. | |
| 5,624,598 A | 4/1997 | Shepodd et al. | |
| 5,672,882 A * | 9/1997 | Day et al. | ............... 250/492.21 |
| 5,763,319 A | 6/1998 | Ling et al. | |
| 5,863,831 A | 1/1999 | Ling | |
| 5,965,482 A | 10/1999 | Heung et al. | |
| 6,013,332 A | 1/2000 | Goto et al. | |
| 6,107,634 A | 8/2000 | Horsky | |
| 6,259,091 B1 * | 7/2001 | Eiden et al. | ................. 250/281 |

(Continued)

FOREIGN PATENT DOCUMENTS

WO    2005059942 A2    6/2005

OTHER PUBLICATIONS

U.S. Appl. No. 11/525,878, filed Sep. 22, 2006.

(Continued)

*Primary Examiner*—Nikita Wells

(57) ABSTRACT

An ion implantation device with a dual pumping mode and method thereof for use in producing atomic or molecular ion beams are disclosed. In one particular exemplary embodiment, an ion implantation apparatus is provided for controlling a pressure within an ion beam source housing corresponding to an ion beam species being produced. The ion implantation apparatus may include the ion beam source housing comprising a plurality of species for use in ion beam production. A pumping section may also be included for evacuating gas from the ion beam source housing. A controller may further be included for controlling the pumping section according to pumping parameters corresponding to a species of the plurality of species being used for ion beam production.

17 Claims, 3 Drawing Sheets

U.S. PATENT DOCUMENTS

| | | |
|---|---|---|
| 6,323,497 B1 | 11/2001 | Walther |
| 6,593,580 B2 | 7/2003 | Miyabayashi |
| 6,744,214 B2 | 6/2004 | Horsky |
| 7,112,804 B2 | 9/2006 | Horsky et al. |
| 2005/0181621 A1 | 8/2005 | Borland et al. |
| 2005/0269520 A1 | 12/2005 | Horsky et al. |
| 2005/0277246 A1 | 12/2005 | Kirkpatrick et al. |
| 2006/0219938 A1 | 10/2006 | Huang |
| 2007/0178678 A1 | 8/2007 | Hatem et al. |
| 2008/0223409 A1 * | 9/2008 | Horsky et al. .............. 134/22.1 |

OTHER PUBLICATIONS

U.S. Appl. No. 11/504,367, filed Sep. 22, 2006.

* cited by examiner

ION IMPLANTATION DEVICE WITH A DUAL PUMPING MODE AND METHOD THEREOF

CROSS-REFERENCE TO RELATED APPLICATIONS

This patent application claims priority to U.S. Provisional Patent Application No. 60/857,954, filed Nov. 8, 2006, which is hereby incorporated by reference herein in its entirety.

FIELD OF THE DISCLOSURE

The present disclosure relates generally to semiconductor manufacturing and, more particularly, to an ion implantation device with a dual pumping mode for use in producing atomic or molecular ion beams.

BACKGROUND OF THE DISCLOSURE

Ion implantation is a conventional technique for introducing dopants into materials such as semiconductor wafers. Dopants may be implanted in a material to form regions of desired conductivity. Such implanted regions can form active regions in resulting devices (e.g., semiconductor devices). Typically, during ion implantation, a source feed gas is ionized in an ion source. The ions are emitted from the source and may be accelerated to a selected energy to form an ion beam. The beam is directed at a surface of the material and the impinging ions penetrate into the bulk of the material and function as dopants that increase the conductivity of the material.

Conventional ion sources may have limitations under certain implantation conditions. For example, conventional ion sources may operate inefficiently at low extraction energies and/or high beam currents which may be used in implantation processes that form implanted regions having ultra-shallow junction depths. Molecules that can be ionized in a standard source conventionally used for atomic implants have been described in copending U.S. application Ser. No. 11/342,183, which is herein incorporated by reference in its entirety.

In view of the foregoing, it may be understood that there are significant problems and shortcomings associated with current ion implantation technologies.

SUMMARY OF THE DISCLOSURE

An ion implantation device with a dual pumping mode and method thereof for use in producing atomic or molecular ion beams are disclosed. In one particular exemplary embodiment, an ion implantation apparatus is provided for controlling a pressure within an ion beam source housing corresponding to an ion beam species being produced. The ion implantation apparatus may include the ion beam source housing comprising a plurality of species for use in ion beam production. A pumping section may also be included for evacuating gas from the ion beam source housing. A controller may further be included for controlling the pumping section according to pumping parameters corresponding to a species of the plurality of species being used for ion beam production.

In accordance with other aspects of this particular exemplary embodiment, the ion implantation apparatus may further include a pressure measurement unit for generating an electrical pressure signal corresponding to a pressure within the ion beam source housing, wherein the controller may adjust the operation of the pumping section based upon the electrical pressure signal.

In accordance with further aspects of this particular exemplary embodiment, the pressure measurement unit may measure a total pressure in the ion beam source housing.

In accordance with additional aspects of this particular exemplary embodiment, the pressure measurement unit may measure a partial pressure of one or more gas constituents in the ion beam source housing.

In accordance with other aspects of this particular exemplary embodiment, the ion implantation apparatus may further include a beam current measurement unit for generating an electrical beam current signal corresponding to a beam current of the ion beam being produced, wherein the controller may adjust the operation of the pumping section based upon the electrical beam current signal.

In accordance with further aspects of this particular exemplary embodiment, the plurality of species may comprise at least a molecular and an atomic species.

In accordance with additional aspects of this particular exemplary embodiment, wherein upon receiving a signal indicating the switching of the species used for ion beam production to another species, the controller may control the pumping section according to pumping parameters corresponding to the another species.

In accordance with other aspects of this particular exemplary embodiment, the controller may control the pumping section by adjusting any number of a rate of pumping, an addition of ballast gas, and a variable valve.

In another particular exemplary embodiment, a method is provided for controlling a pressure within an ion beam source housing corresponding to an ion beam species being produced. The method may comprise producing an ion beam using one of a plurality of species within an ion beam source housing, evacuating gas from the ion beam source housing a pumping section, and controlling the pumping section according to pumping parameters corresponding to the species of the plurality of species being used for ion beam production.

In accordance with other aspects of this particular exemplary embodiment, the method may further include generating an electrical pressure signal, by a pressure measurement unit, corresponding to a pressure within the ion beam source housing, wherein the controller may adjust the operation of the pumping section based upon the electrical pressure signal.

In accordance with further aspects of this particular exemplary embodiment, the pressure measurement unit may measure a total pressure in the ion beam source housing.

In accordance with additional aspects of this particular exemplary embodiment, the pressure measurement unit may measure a partial pressure of one or more gas constituents in the ion beam source housing.

In accordance with other aspects of this particular exemplary embodiment, the method may further include generating an electrical beam current signal, by a beam current measurement unit, corresponding to a beam current of the ion beam being produced, wherein the controller may adjust the operation of the pumping section based upon the electrical beam current signal.

In accordance with further aspects of this particular exemplary embodiment, the plurality of species may comprise at least a molecular and an atomic species.

In accordance with additional aspects of this particular exemplary embodiment, upon receiving a signal indicating the switching of the species used for ion beam production to another species, the controller may control the pumping section according to pumping parameters corresponding to the another species.

In accordance with other aspects of this particular exemplary embodiment, the controller may control the pumping section by adjusting any number of a rate of pumping, an addition of ballast gas, a variable valve.

In another particular exemplary embodiment, at least one processor readable carrier is provided for storing a computer program of instructions configured to be readable by at least one processor for instructing the at least one processor to execute a computer process for performing a method for controlling a pressure within an ion beam source housing corresponding to an ion beam species being produced.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Figure 1:
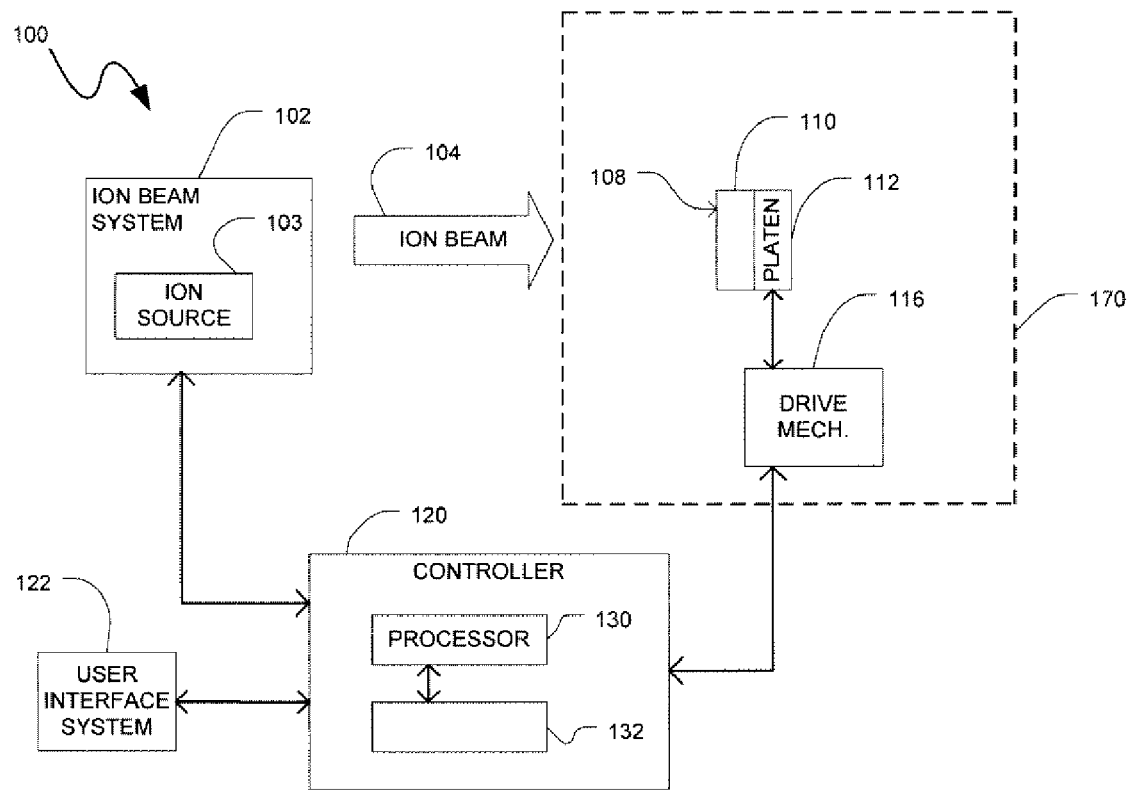
FIG. 1 shows a block diagram of a beam line ion implanter in accordance with an embodiment of the present disclosure.

Referring to FIG. 1, there is shown a block diagram of a beam line ion implanter in accordance with an embodiment of the present disclosure. The beam line ion implanter 100 may include an ion beam system 102, an end station 170, a controller 120, and a user interface system 122. The ion beam system 102 includes an ion source 103 to generate an ion beam and other components and systems to direct the ion beam 104 toward a target surface 108 of a substrate 110 positioned in the end station 170. The ion beam 104 may be distributed over the target surface 108 of the substrate 110 by beam movement, substrate movement, or by any combination thereof.

The ion beam system 102 can include various types of components and systems to generate and direct the ion beam 104 having desired characteristics. The ion beam 104 may be a spot beam or a ribbon beam. The spot beam may have an irregular cross-sectional shape that may be approximately circular in one instance. The spot beam may be a fixed or stationary spot beam without a scanner. Alternatively, the spot beam may be scanned by a scanner for providing a scanned ion beam. The ribbon beam may have a large width/height aspect ratio and may be at least as wide as the substrate 110. The ion beam 104 can be any type of charged particle beam, such as an energetic ion beam used to implant the substrate 110.

The end station 170 may support one or more substrates in the path of the ion beam 104 such that ions of the desired species are implanted into the substrate 110. The substrate 110 may be supported by the platen 112 and clamped to the platen 112 by known techniques such as electrostatic substrate clamping. The substrate 110 can take various physical shapes such as a common disk shape. The substrate 110 can be a semiconductor substrate fabricated from any type of semiconductor material such as silicon or any other material that is to be implanted using the ion beam 104.

The end station 170 may include a substrate drive system (not illustrated) to physically move the substrate 110 to and from the platen 112 from holding areas. The end station 170 may also include a drive mechanism 116 to drive the platen 112 and hence the substrate 110 clamped to the platen 112 in a desired way.

The controller 120 may receive input data and instructions from any variety of systems and components of the beam line ion implanter 100 and provide output signals to control the same. The controller 120 can be or include a general-purpose computer or network of general-purpose computers that may be programmed to perform desired input/output functions. The controller 120 may include a processor 130 and a machine readable medium 132. The processor 130 may include one or more processors known in the art such as those commercially available from Intel Corporation. The machine readable medium 132 may include on or more machine readable storage media such as random-access memory (RAM), dynamic RAM (DRAM), magnetic disk (e.g., floppy disk and hard drive), optical disk (e.g., CD-ROM), and/or any other device that can store instructions for execution. The controller 120 can also include other electronic circuitry or components, such as application specific integrated circuits, other hardwired or programmable electronic devices, discrete element circuits, etc.

The user interface system 122 may include, but not be limited to, devices such as touch screens, keyboards, user pointing devices, displays, printers, etc. to allow a user to input commands and/or data and/or to monitor the beam line ion implanter 100 via the controller 120.

High perveance, that is, low energy, high beam current, ion beams suffer from space charge blow up where like charged ions in the ion beam mutually repel each other causing the beam to expand. This limits the magnitude of the beam current that can be transported in a beam-line. When the like charged ions are positive ions, the repulsion can be controlled by introducing electrons into the ion beam. The negative charges on the electrons counteract the repulsion of the positive ions. One method of electron formation occurs when the ions of the ion beam collide with background gas present in the vacuum. Low energy beam transport efficiency can often be improved by increasing the pressure of background gas present to increase the electron production. If the pressure becomes too high, however, too large a fraction of the beam ions undergo charge exchange interactions, and beam current is lost. It is known in the art that pressure can be chosen to optimize beam transport. This has been achieved in the past by introducing gas into the region immediately after extraction from the ion source 103 or further downstream. Gas, and plasma, introduced by electron beam and plasma flood systems used to neutralize charge build up on the wafer surface have also often improved beam transport.

Molecular beams may be of lower perveance, that is higher energy and lower beam current, than atomic beams. The plurality of atoms in the molecule shares the kinetic energy of the molecule according to their atomic masses. This means that to achieve a shallow implant equivalent to a low energy atomic beam, a molecular beam may be transported at a higher energy. The molecule may contain several atoms of the species of interest (for example a dopant species such as boron). The molecule may be transported as a singly charged species, and so the molecular beam current required to match the flux of the species of interest in an atomic beam may be smaller by the ratio of the number of atoms of interest in the molecule. The transport of the molecular beams at higher energies and lower electrical beam currents may mean that space charge may not be such an important issue to overcome. However, the breakup of molecules caused by collisions with background gas is a significant loss mechanism, not present for atomic beams. Therefore, that the optimum pressure for molecular beam transport may not be the same as for atomic beams.

The conditions in the ion source arc chamber may also be tuned depending on the process. Often it may be required to tune the beam current by a few percent in intensity to achieve an accurate dose into the wafer. The ionization properties in an ion source may be modified by altering parameters such as, for example, pressure (feed rate), arc voltage, arc current (via cathode emission), and magnetic field associated with the source. For molecular ions, it is found that varying these parameters cannot produce a sufficiently fine control of beam current. Varying the arc voltage, arc current, or magnetic field as done for atomic beams may cause the discharge to extinguish. Molecules, because of their heavier weight, tend to be formed from solids using ovens. Feed rate may be controlled by changing the temperature of the oven. The time for the oven temperature to stabilize may be too long for this to be an efficient mechanism for controlling feed supply. The pressure in the source housing will influence the pressure in the arc chamber, which affects the ionization efficiency in the source plasma. Therefore molecular beam current may be controlled by tuning the source housing pressure.

Figure 2:
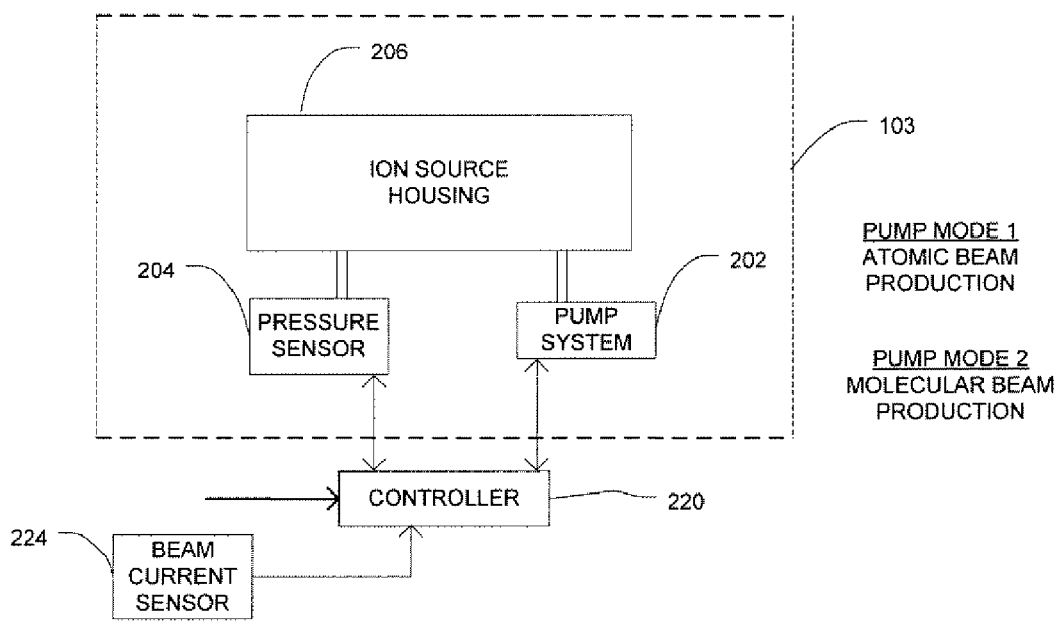
FIG. 2 is a block diagram of the ion source of FIG. 1.

What is required therefore is a method by which the pressure can be changed depending on the species being produced, and continuously varied to control the beam current produced. FIG. 2 illustrates a block diagram of the ion source 103 of FIG. 1 in more detail. The ion source 103 may include an ion source housing 206, a pump system 202, a pressure sensor 204, and the controller 220. The controller 220 may be the controller 120 of FIG. 1 or a separate controller. The controller 220 may operate the pump system 202 to maintain a desired pressure in the ion source housing 206.

The controller 220 may operate the pump system 202 in a first pump mode for atomic ion beam production and in a second pump mode for molecular ion beam production. An initial recipe specifying an atomic ion beam production or a molecular ion beam production may be detailed by a user via the user interface system 122 or may be accessed from a memory coupled to the controller 220. The controller 220 may operate the pump system 202 according to pumping parameters associated with the source feed material being used. In response, the controller 220 may control the pump system 202 to operate in the first or second pumping mode. The controller 220 may also be responsive to different feedback signals representative of varying conditions of the beam line implanter. The feedback signals may be from the pressure sensor 204 detailing a pressure of the ion source housing and/or a beam current sensor 224, e.g., a Faraday sensor as is known in the art in one embodiment. The feedback signal from the beam current sensor 224 may be utilized by the controller 220 to control the vacuum pressure in order to maximize the beam current or modify it to a controlled value.

When molecules are formed, break-up occurs leading to many fragments. Break-up occurs due to, for example, pyrolysis on hot ion source arc chamber walls; pyrolysis on the hot vaporizer walls; or due to collisions with electron, ions, or atoms in the ions source arc chamber and ion source housing. A large fraction of the fragments may be hydrogen, and this can typically be more difficult to pump than larger mass fragments. Therefore, the pumping speed for the second molecular ion beam pumping mode may be greater than the pumping speed for the first atomic ion beam pumping mode.

Figure 3:
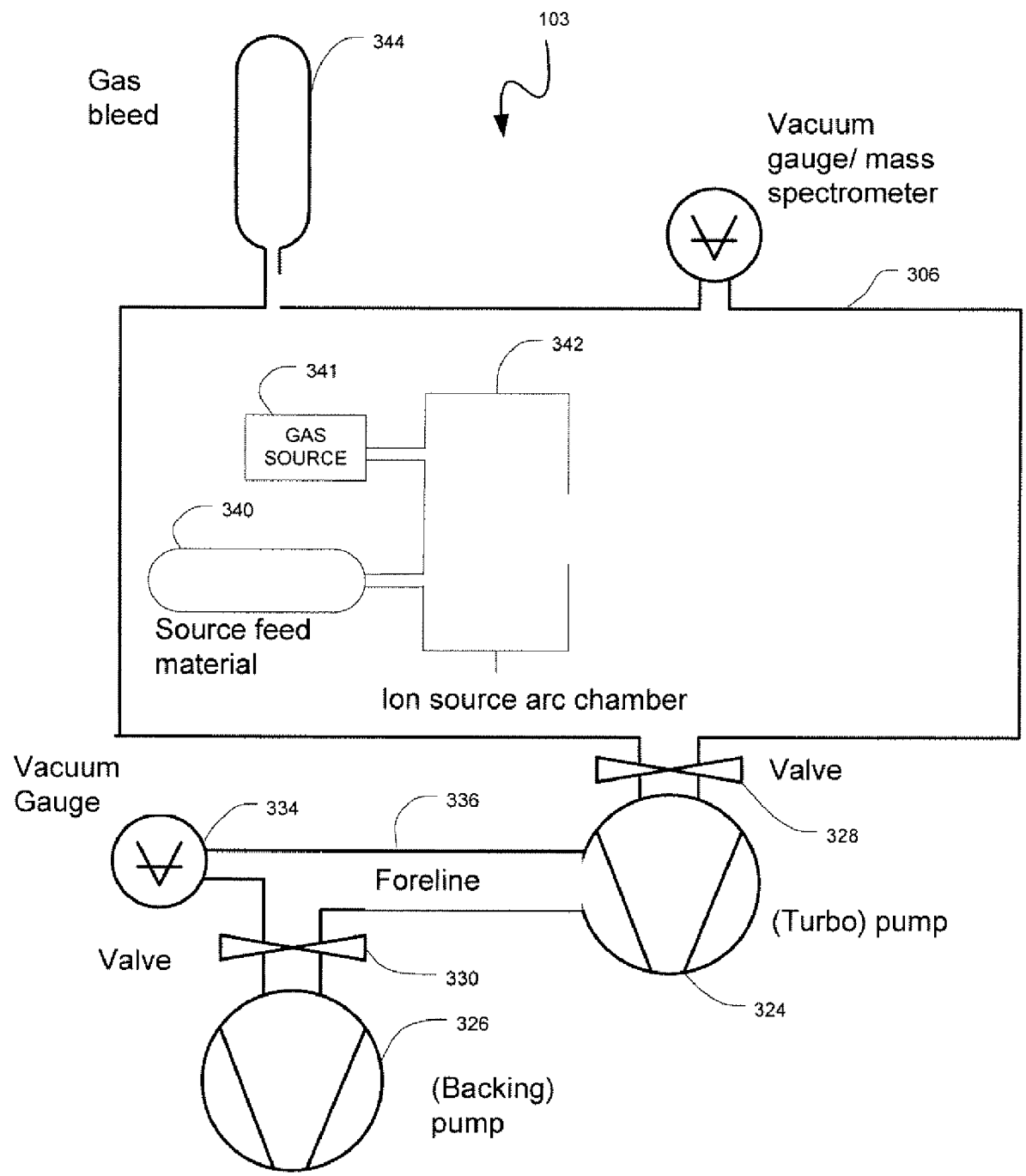
FIG. 3 is a block diagram of one embodiment consistent with the ion source of FIG. 2.

Turning to FIG. 3, a block diagram of a vacuum system of an ion source consistent with that of FIG. 2 is illustrated. The vacuum system may include ion source housing 306. A vaporizer 340 may contain a source feed material for the ion source arc chamber 342 for formation of a molecular ion beam and a gas source 341 may contain a source gas for formation of an atomic ion beam. Although illustrated as within the ion source housing 306, the gas source 341 may also be positioned outside of the ion source housing 306.

The ion source housing 306 may be pumped by one or more turbo pumps 324, which may be further backed by a mechanical pump 326 such as rotary or dry pumps as they achieve a high gas throughput. Preferably, the controller may change the pumping speeds by changing the speed of the turbo rotation. However, the controller may also change the pumping speed by adding a ballast gas at the throat or in the vanes of the turbo pump 324, by changing the speed of the backing pump 326 (for example by changing its rotation speed or adding a ballast gas into the backing pump), by using a variable valve 328 (such as a butterfly valve) above the turbo pump 324, or a variable valve 330 in the backing line. Alternatively, a gas bleed 344 into the source could be used.

A vacuum regime may be described by the choice of one or more of the variables described above. One vacuum regime (pump mode 1) may be chosen as a starting point during atomic beam production, and an alternative vacuum regime (pump mode 2) for molecular beam production. This may be to set values defined in a recipe. Alternatively the total vacuum pressure or partial pressure of a gas component may be set to a chosen value. The value may correspond to a total pressure as measured by a vacuum gauge 334, mounted either on the source housing or elsewhere, such as the pump foreline 336. At typical operating pressures likely to be in the source housing, the gauge 334 may be an ionization gauge (e.g. cold or hot cathode), which will measure the total pressure in the source housing. Alternatively, apparatus such as a quadrupole or time of flight mass spectrometers could be used to measure the partial pressures of different species that are present in the residual vacuum. A feedback signal generated from one or more of the pressure measuring instruments could be used to change one or more of the parameters listed above to control the vacuum regime. The feedback signal may be related to the total pressure, or partial pressure of one or more of the gas constituents, such as hydrogen, but may be any other species partial pressure, or sum of partial pressures of a plurality of species.

The vacuum pressure may be altered based on a beam current measurement. The beam current may come from a faraday or other detector used as part of the dosimetry system. Alternatively the faraday may be elsewhere in the beamline, such as immediately after the mass analysis magnet. The mass measured may be the molecule that is to be implanted, or may be another molecular fragment which may be known to be related to the implanted beam current. The feedback signal from the beam current detector may be used to control the vacuum pressure to maximize the beam current, or modify it to a required value.

Figure 4:
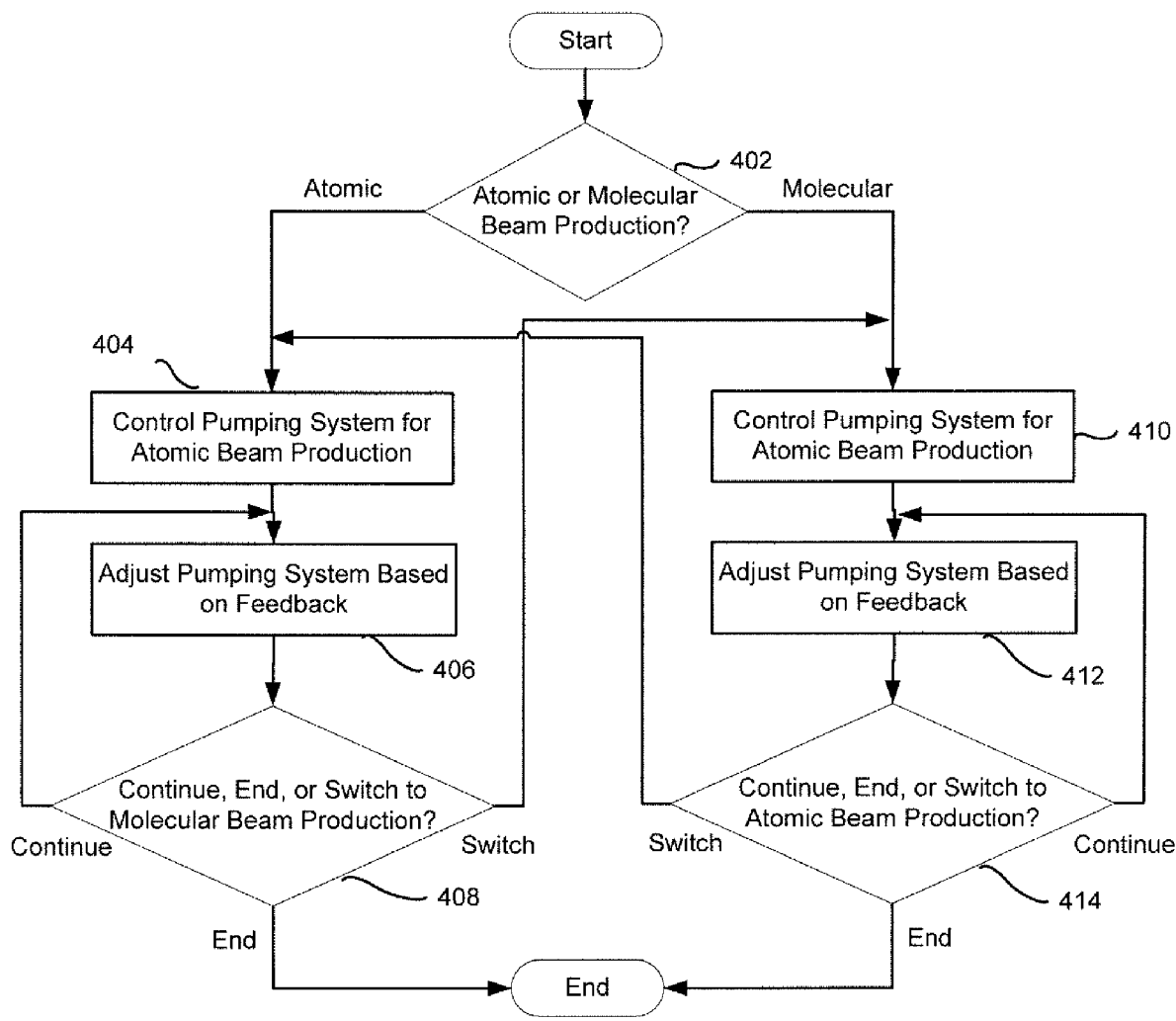
FIG. 4 is a flow chart illustrating one embodiment of a dual pumping technique in accordance with an embodiment of the present disclosure.

Turning to FIG. 4, is a flow chart illustrating one embodiment for controlling a pressure within an ion beam source housing depending on whether an atomic or molecular beam is being produced. In step 402, it is determined whether an atomic or molecular beam is to be produced. The determination may be based on a user input or may be based on a controlled operation. If an atomic beam is to be produced, the operation moves to step 404. In step 404, the beam line ion implanter is configured to generate a beam using an atomic source.

In configuring the beam line ion implanter to generate a beam using an atomic beam source, the controller 220 controls the pumping system 202 according to a vacuum regime that corresponds to the atomic beam source. The values used by the controller 220 to control the pumping system 202 for the atomic beam source may be input by the user or derived from values stored in a memory coupled to the controller 220. Once the atomic beam production has commenced, and the controller 220, in step 406, continuously varies the pumping system according to feed back signals, such as the pressure or beam current feedback signals discussed above.

In step 408, controller 220 determines if the atomic beam production is to continue, end, or be switched to a molecular beam production. If in step 408, controller 220 determines that the atomic beam production is to continue, operation returns to step 406. However, if controller 220 determines that the atomic beam production is to end, the pump control operation is ended. If controller 220 determines that the atomic beam production is to be switched to a molecular beam production, then operation is transferred to step 410. Steps 410, 412 and 414 operate in similar manner to the operations described in steps 404, 406 and 408 respectively, accordingly a description thereof will be omitted.

At this point it should be noted that an ion implantation device with a dual pumping mode in accordance with the present disclosure as described above typically involves the processing of input data and the generation of output data to some extent. This input data processing and output data generation may be implemented in hardware or software. For example, specific electronic components may be employed in an ion implantation device with a dual pumping mode or similar or related circuitry for implementing the functions associated with controlling a pressure within an ion beam source housing corresponding to an ion beam species being produced in accordance with the present disclosure as described above. Alternatively, one or more processors operating in accordance with stored instructions may implement the functions associated with the ion implantation device with a dual pumping mode in accordance with the present disclosure as described above. If such is the case, it is within the scope of the present disclosure that such instructions may be stored on one or more processor readable carriers (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An ion implantation apparatus for controlling a pressure within an ion beam source housing corresponding to an ion beam species being produced, comprising:
    an ion beam source housing comprising a plurality of species for use in ion beam production;
    a pumping section for evacuating gas from the ion beam source housing; and
    a controller for controlling the pumping section according to pumping parameters corresponding to a species of the plurality of species being used for ion beam production.

2. The ion implantation apparatus of claim 1, wherein the ion implantation apparatus further comprises:
    a pressure measurement unit for generating an electrical pressure signal corresponding to a pressure within the ion beam source housing,
    wherein the controller adjusts the operation of the pumping section based upon the electrical pressure signal.

3. The ion implantation apparatus of claim 2, wherein the pressure measurement unit measures a total pressure in the ion beam source housing.

4. The ion implantation apparatus of claim 2, wherein the pressure measurement unit measures a partial pressure of one or more gas constituents in the ion beam source housing.

5. The ion implantation apparatus of claim 1, wherein the ion implantation apparatus further comprises:
    a beam current measurement unit for generating an electrical beam current signal corresponding to a beam current of the ion beam being produced,
    wherein the controller adjusts the operation of the pumping section based upon the electrical beam current signal.

6. The ion implantation apparatus of claim 1, wherein the plurality of species comprises at least a molecular and an atomic species.

7. The ion implantation apparatus of claim 1, wherein upon receiving a signal indicating the switching of the species used for ion beam production to another species, the controller controls the pumping section according to pumping parameters corresponding to the another species.

8. The ion implantation apparatus of claim 1, wherein the controller controls the pumping section by adjusting any number of a rate of pumping, an addition of ballast gas, and a variable valve.

9. A method for controlling a pressure within an ion beam source housing corresponding to an ion beam species being produced, comprising:
    producing an ion beam using one of a plurality of species within an ion beam source housing;
    evacuating gas from the ion beam source housing a pumping section; and
    controlling the pumping section according to pumping parameters corresponding to the species of the plurality of species being used for ion beam production.

10. The method of claim 9, further comprising:
    generating an electrical pressure signal, by a pressure measurement unit, corresponding to a pressure within the ion beam source housing,
    wherein the controller adjusts the operation of the pumping section based upon the electrical pressure signal.

11. The method of claim 10, wherein the pressure measurement unit measures a total pressure in the ion beam source housing.

12. The method of claim 10, wherein the pressure measurement unit measures a partial pressure of one or more gas constituents in the ion beam source housing.

13. The method of claim 9, wherein the ion implantation apparatus further comprises:

generating an electrical beam current signal, by a beam current measurement unit, corresponding to a beam current of the ion beam being produced, wherein the controller adjusts the operation of the pumping section based upon the electrical beam current signal.

14. The method of claim 9, wherein the plurality of species comprises at least a molecular and an atomic species.

15. The method of claim 9, wherein upon receiving a signal indicating the switching of the species used for ion beam production to another species, the controller controls the pumping section according to pumping parameters corresponding to the another species.

16. The method of claim 9, wherein the controller controls the pumping section by adjusting any number of a rate of pumping, an addition of ballast gas, and a variable valve.

17. At least one processor readable carrier for storing a computer program of instructions configured to be readable by at least one processor for instructing the at least one processor to execute a computer process for performing the method as recited in claim 9.

* * * * *